(12) United States Patent
Vora

(10) Patent No.: US 7,525,163 B2
(45) Date of Patent: Apr. 28, 2009

(54) SEMICONDUCTOR DEVICE, DESIGN METHOD AND STRUCTURE

(75) Inventor: Madhukar B. Vora, Los Gatos, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 0 days.

(21) Appl. No.: 11/590,265

(22) Filed: Oct. 31, 2006

(65) Prior Publication Data

US 2008/0099873 A1  May 1, 2008

(51) Int. Cl.
| | | |
|---|---|---|
| H01L 29/76 | (2006.01) | |
| H01L 29/94 | (2006.01) | |
| H01L 31/062 | (2006.01) | |
| H01L 31/113 | (2006.01) | |
| H01L 31/119 | (2006.01) | |
| H01L 27/11 | (2006.01) | |

(52) U.S. Cl. ................................ 257/393; 257/903
(58) Field of Classification Search ......... 257/393–401, 257/903–904
See application file for complete search history.

(56) References Cited

U.S. PATENT DOCUMENTS

| | | | |
|---|---|---|---|
| 3,930,300 | A | 1/1976 | Nicolay |
| 3,936,929 | A | 2/1976 | Bean et al. |
| 3,943,551 | A | 3/1976 | Skorup |
| 3,951,702 | A | 4/1976 | Kano et al. |
| 3,955,182 | A | 5/1976 | Bert |
| 3,967,305 | A | 6/1976 | Zuleeg |
| 3,982,264 | A | 9/1976 | Ishitani |
| 4,036,672 | A | 7/1977 | Kobayashi |

(Continued)

FOREIGN PATENT DOCUMENTS

EP    0193842    9/1986

(Continued)

OTHER PUBLICATIONS

PCT International Search Report and Written Opinion of the International Searching Authority for International Application, PCT/US2007/071075, dated Apr. 25, 2008.

(Continued)

*Primary Examiner*—Cuong Q Nguyen
(74) *Attorney, Agent, or Firm*—Haverstock & Owens, LLP

(57) ABSTRACT

A semiconductor device can include at least a first diffusion region formed by doping a semiconductor substrate and at least a second diffusion region formed by doping the semiconductor substrate that is separated from the first diffusion region by an isolation region. At least a first conductive line can comprise a semiconductor material formed over and in contact with the first diffusion region and the second diffusion region. A portion of the first conductive line in contact with the first diffusion region is doped to an opposite conductivity type as the first diffusion region. At least a second conductive line comprising a semiconductor material is formed in parallel with the first conductive line and over and in contact with the first diffusion region and the second diffusion region. A portion of the second conductive line can be in contact with the first diffusion region and doped to a same conductivity type as the first diffusion region. A portion of the second conductive line in contact with the second diffusion region can be doped to a same conductivity type as the second diffusion region.

11 Claims, 11 Drawing Sheets

U.S. PATENT DOCUMENTS

| | | | |
|---|---|---|---|
| 4,038,563 | A | 7/1977 | Zuleeg et al. |
| 4,040,082 | A | 8/1977 | Goser |
| 4,062,036 | A | 12/1977 | Yoshida |
| 4,064,525 | A | 12/1977 | Kano et al. |
| 4,126,900 | A | 11/1978 | Koomen et al. |
| 4,613,772 | A | 9/1986 | Young |
| 4,638,344 | A | 1/1987 | Cardwell, Jr. |
| 4,698,653 | A | 10/1987 | Cardwell, Jr. |
| 4,751,556 | A | 6/1988 | Cogan et al. |
| 4,763,028 | A | 8/1988 | Henry |
| 4,777,517 | A | 10/1988 | Onodera et al. |
| 4,853,561 | A | 8/1989 | Gravrok |
| 5,130,770 | A | 7/1992 | Blanc et al. |
| 5,424,663 | A | 6/1995 | Wong |
| 5,973,341 | A | 10/1999 | Letavic et al. |
| 6,307,223 | B1 | 10/2001 | Yu |
| 6,378,114 | B1 | 4/2002 | Shenoy et al. |
| 7,405,447 | B2 * | 7/2008 | Tang et al. .................. 257/903 |
| 2002/0190398 | A1 * | 12/2002 | Morishima et al. .......... 257/903 |
| 2007/0096144 | A1 | 5/2007 | Kapoor |
| 2007/0126478 | A1 | 6/2007 | Kapoor |
| 2007/0284628 | A1 | 12/2007 | Kapoor |

FOREIGN PATENT DOCUMENTS

| | | |
|---|---|---|
| EP | 0 276 670 | 8/1988 |
| JP | 59 061317 A | 4/1984 |
| JP | 60-258948 | 12/1985 |
| NL | 7 203 662 A | 9/1972 |

OTHER PUBLICATIONS

English Abstract of JP 59 061317 from the European Patent Office.

PCT International Search Report for International Application No. PCT/US2007/082781, dated May 20, 2008.

PCT Written Opinion of the International Searching Authority for International Application No. PCT/US2007/082781, dated May 20, 2008.

Hamadè, Adib R., "A JFET/Bipolar Eight-Channel Analog Multiplexer", *IEEE Journal of Solid-State Circuits*, Dec. 1975, pp. 399-406, vol. SC-10, No. 6.

Takagi et al., "Complementary JFET Negative-Resistance Devices", *IEEE Journal of Solid-State Circuits*, Dec. 1975, pp. 509-515, vol. SC-10, No. 6.

Lehovec, Kurt, "Analysis of GaAs FET's for Integrated Logic", *IEEE Transactions on Electron Devices*, Jun. 1980, pp. 1074-1091, vol. ED-27, No. 6.

Ozawa, Osuma, "Electrical Properties of a Triode-Like Silicon Vertical-Channel JFET", *IEEE Transactions on Electron Devices*, Nov. 1980, pp. 2115-2123, vol. ED-27, No. 11.

Nanver et al., "Design Considerations for Integrated High-Frequency p-Channel JFET's", *IEEE Transactions on Electron Devices*, Nov. 1988, pp. 1924-1934, vol. 35, No. 11.

Chetput et al., "Custom Netlist Procedures in AMS Designer", *International Cadence Usergroup Conference*, Sep. 13-15, 2004, Santa Clara, California.

\* cited by examiner

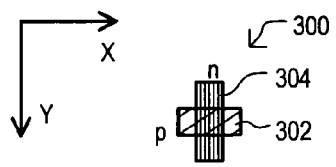
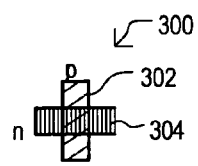
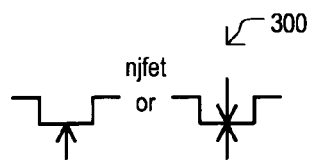
FIG. 3A  FIG. 3B  FIG. 3C
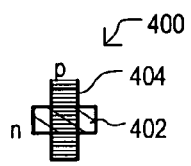
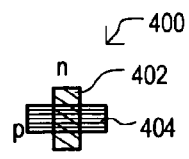
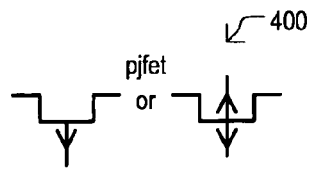
FIG. 4A  FIG. 4B  FIG. 4C
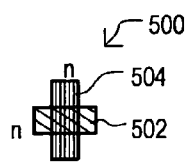
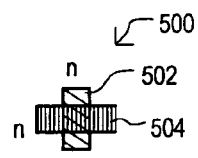
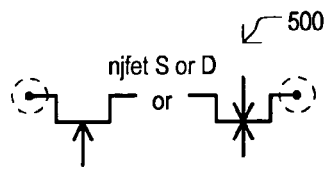
FIG. 5A  FIG. 5B  FIG. 5C
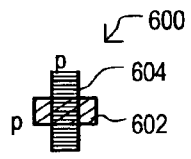
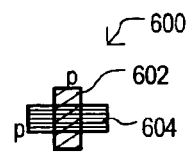
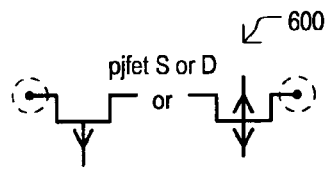
FIG. 6A  FIG. 6B  FIG. 6C
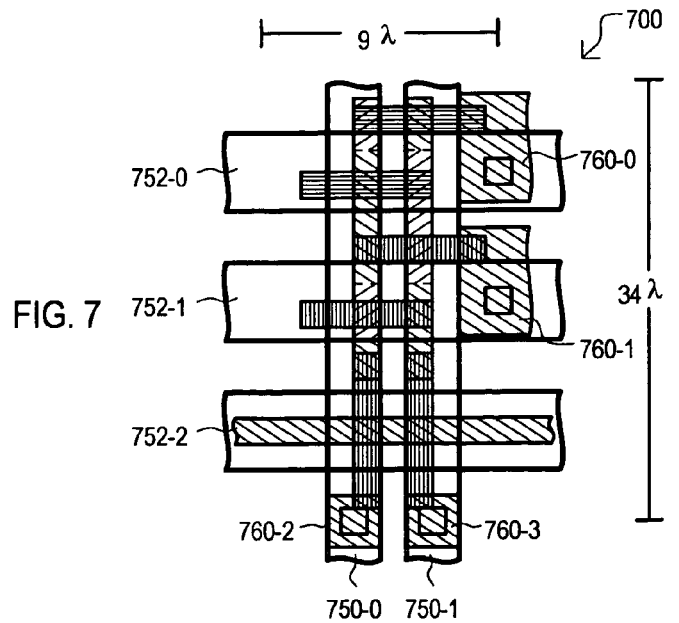
FIG. 7

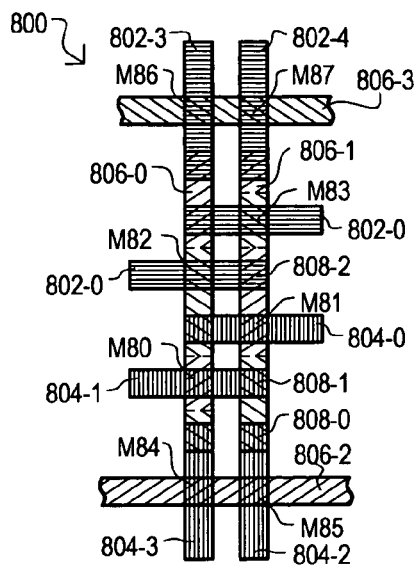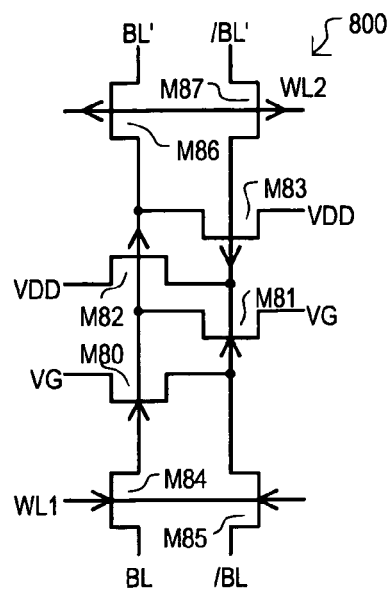
FIG. 8A    FIG. 8B
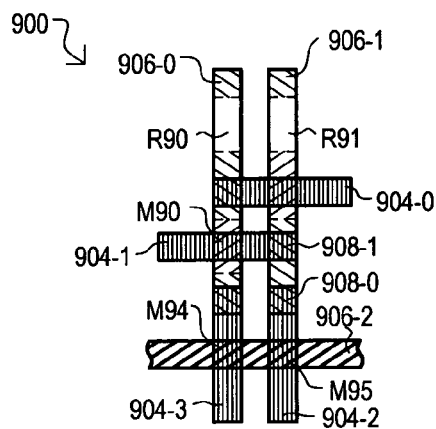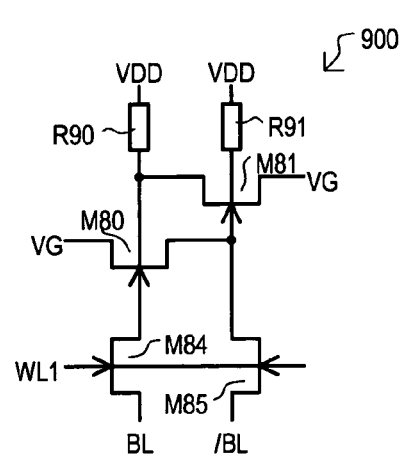
FIG. 9A    FIG. 9B
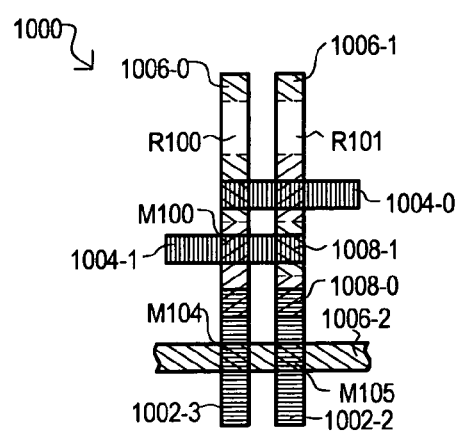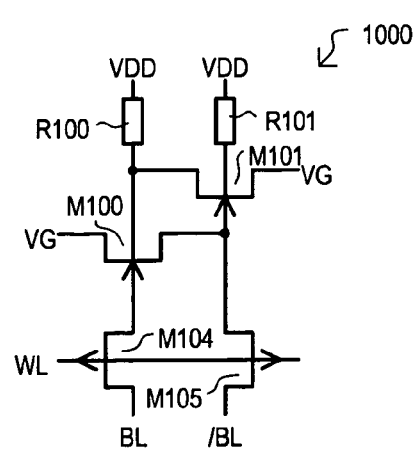
FIG. 10A    FIG. 10B

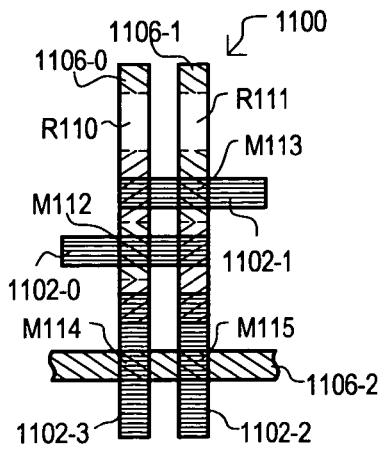
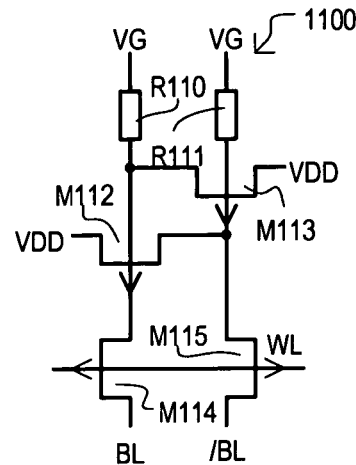
FIG. 11A          FIG. 11B
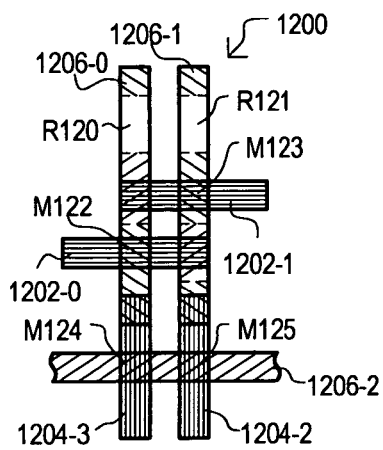
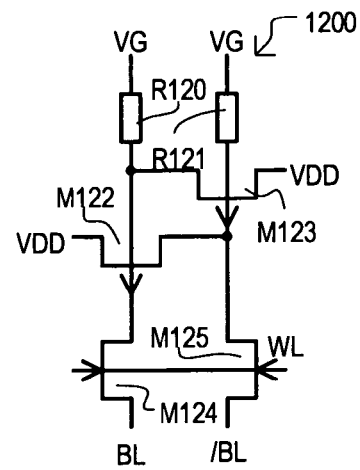
FIG. 12A          FIG. 12B
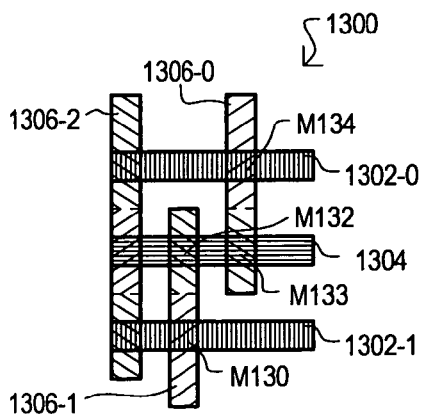
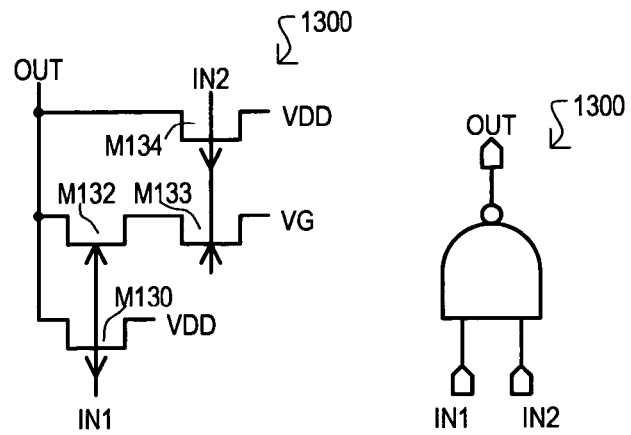
FIG. 13A          FIG. 13B          FIG. 13C

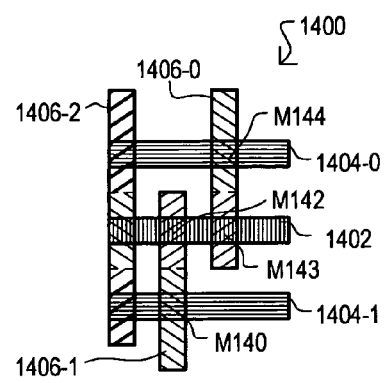
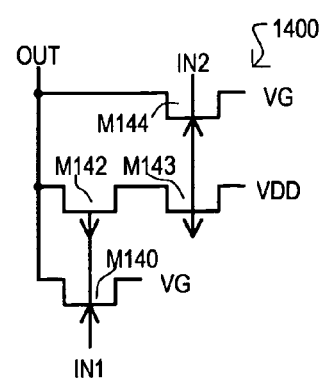
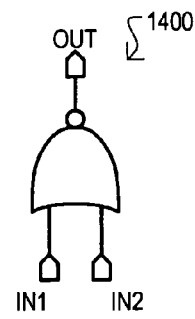
FIG. 14A  FIG. 14B  FIG. 14C
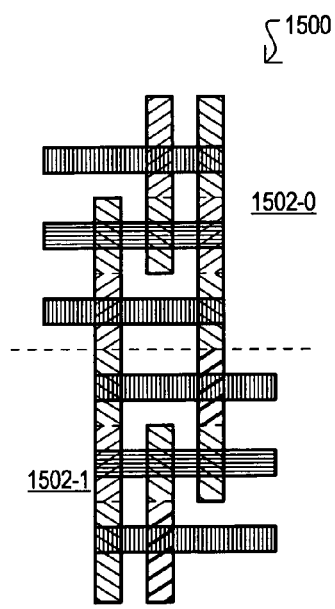
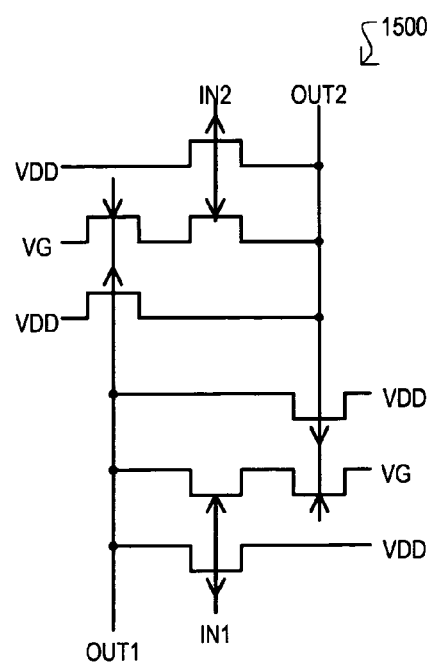
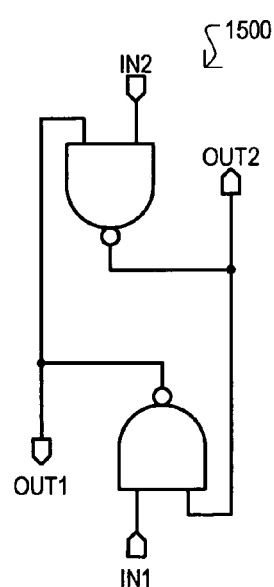
FIG. 15A  FIG. 15B  FIG. 15C

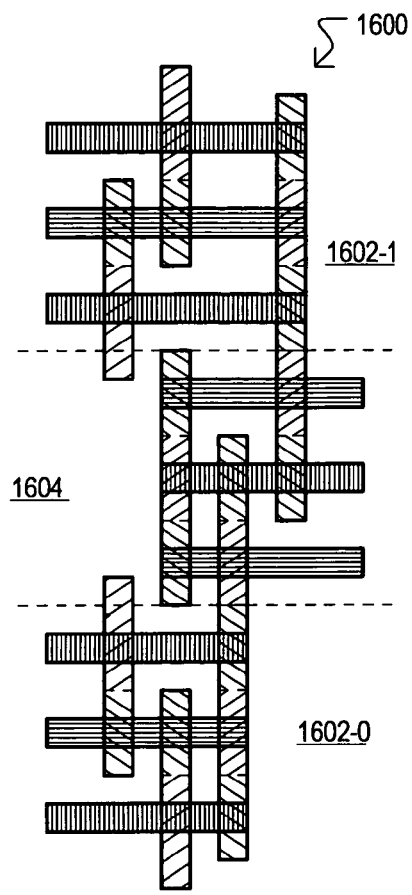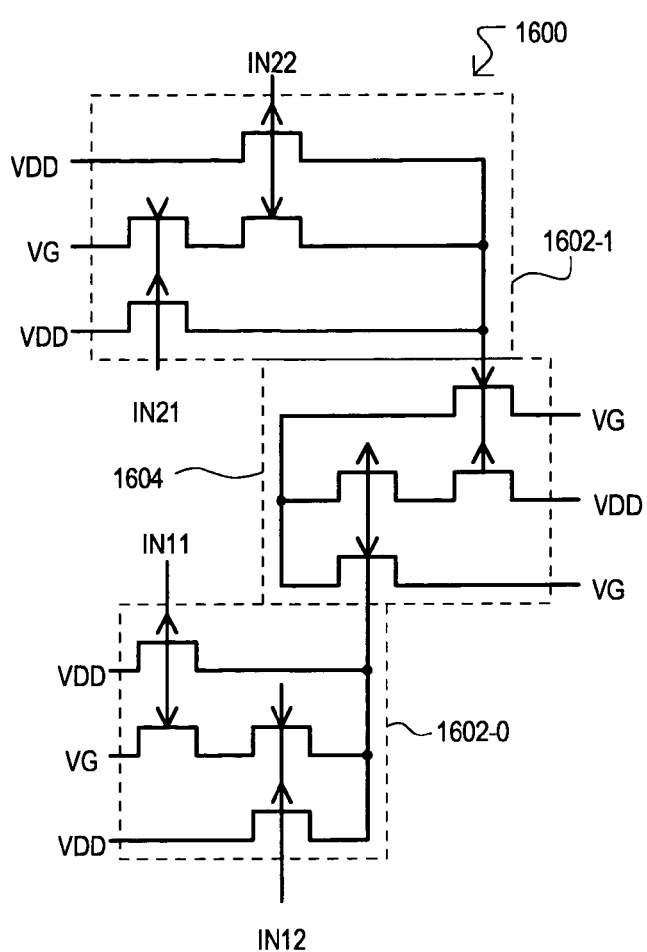
FIG. 16A          FIG. 16B
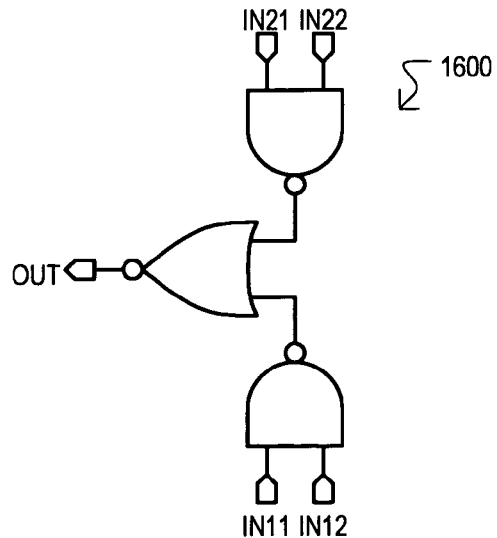
FIG. 16C

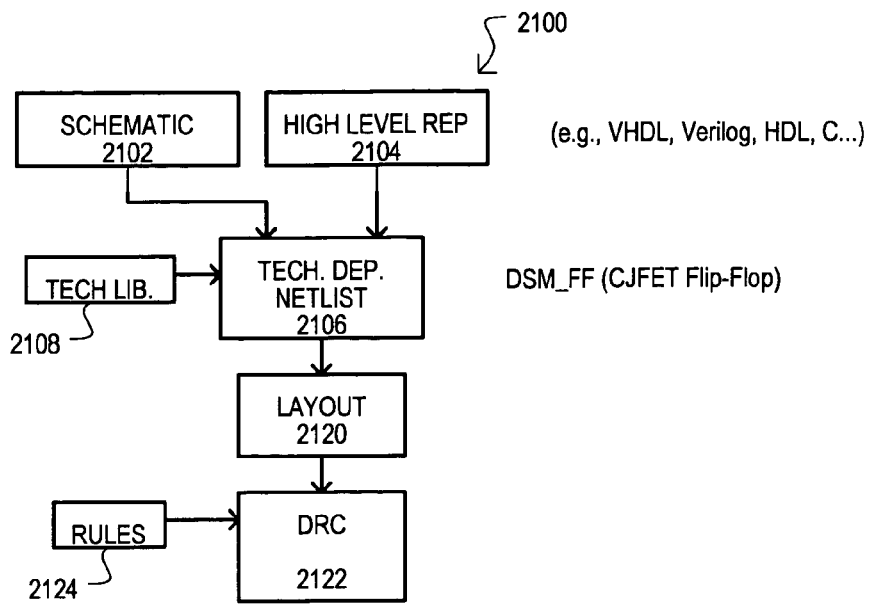

FIG. 21

```
//Netlist
    |
    |
  module ckt_sample (in1, in2, in3, in4, out1)

njfet (width(2um), length(45nm))
        (*library = 'DSM_lib'; *)
    M0 (gate1=net1, drain=net2, source=net3, gate2=gnd!)
    |
    |
  pjfet (width(2um), length(45nm))
        (*library = 'DSM_lib'; *)
    M1 (gate1=net2, drain=net3, source=net4, gate2=Vpos)
    |
    |                                                          } 2202 module ckt_intMOS (in40, in42, in43, in44, out5)

nmos (width(2um), length(45nm))
        (*library = 'DSM_lib'; *)
    M20 (gate1=net30, drain=net31, source=gnd!)
  pmos (width(2um), length(45nm))
        (*library = 'DSM_lib'; *)
    M21 (gate1=net30, drain=net31, source=Vpos)
    |                                                          } 2204
    |
```

FIG. 22

SEMICONDUCTOR DEVICE, DESIGN METHOD AND STRUCTURE

TECHNICAL FIELD

The present invention relates generally to semiconductor circuits, and more particularly to semiconductor circuits having interconnected field effect transistors, methods of designing such circuits, and data structures representing such circuits.

BACKGROUND OF THE INVENTION

Integrated circuit devices typically include a number of circuit sections interconnected with one another. While such integrated circuits can include sections custom designed at a device level, often circuit sections have a commonly understood functionality, such as a logic function and/or storage functions.

Designing integrated circuits can benefit from automation. For example, an integrated circuit can be initially represented at some higher level. Through automation and optimization, such a higher level design representation can be translated into more detailed forms, such as a netlist, a physical netlist, or a physical design.

Presently, most automated design approaches can be used to implement a design with a programmable logic device (PLD), or as an application specific integrated circuit (ASIC). In the case of a PLD, the more detailed design representation can be transformed into configuration data for the PLD, which can be used to program the PLD to the desired function. In the case of an ASIC, the more detailed design representation can be translated into a set of masks utilized to manufacture the integrated circuit. Currently, ASICs are typically composed of complementary metal-oxide-semiconductor (CMOS) type circuits.

Commonly owned, co-pending U.S. patent application Ser. No. 11/261,873 filed on Oct. 28, 2005, titled "INTEGRATED CIRCUIT USING COMPLEMENTARY JUNCTION FIELD EFFECT TRANSISTOR AND MOS TRANSISTOR IN SILICON AND SILICON ALLOYS", and Ser. No. 11/452,442 filed on Jun. 13, 1006, titled "CIRCUIT CONFIGURATIONS HAVING FOUR TERMINAL JFET DEVICES", both by Ashok K. Kapoor, disclose, amongst other matters, junction field effect transistors (JFETs) and related circuits formed by patterning a layer of polysilicon, or some other semiconductor material, deposited on a semiconductor substrate.

To better understand various features of the disclosed embodiments, a conventional integrated circuit section will now be described.

FIG. 24A shows a conventional CMOS-type six-transistor static random access memory (SRAM) cell 2400. FIG. 24B shows a schematic diagram representation of the SRAM cell of FIG. 24A. Transistors shown in FIG. 24B are identified by the same labels in FIG. 24A.

FIG. 24A shows shapes corresponding to five different layers 2402 to 2410, each shown with a different hatching pattern. Each layer can correspond to a different layer of an integrated circuit, or a different fabrication mask for the integrated circuit. Layer 2402 can be an n-channel MOS transistor active area. More particularly, layer 2402 can define a region of a semiconductor substrate initially doped to a p-type conductivity. Similarly, layer 2404 can be a p-channel MOS transistor active area. For example, layer 2404 can define a region of a substrate initially doped to an n-type conductivity. Layer 2406 can be a polycrystalline silicon (polysilicon) layer that provides gates for MOS devices, as well as interconnections for such gates. Layer 2408 can be first metallization layer formed over polysilicon layer 2406 that can provide interconnections between transistor gates and sources/drains as well as complementary bit lines BL and /BL. Layer 2410 can be a second metallization layer formed over the first metallization layer 2408 that can form a word line WL, as well as supply lines for a high power supply VDD and a low power supply VG.

In the very particular example of FIG. 24A, it is assumed that a minimum feature size of a process utilized to manufacture the SRAM cell can be defined by the value 2λ. Further, a resulting SRAM cell can have dimensions 46λ×56λ.

BRIEF DESCRIPTION OF THE DRAWINGS

FIGS. 3A to 6C are top plan views and schematic representations of basic design elements that can form circuits according to the embodiments.

FIG. 7 is a top plan view of the circuit of FIGS. 1A to 1D with additional layers.

FIGS. 8A and 8B show a top plan view and a schematic diagram of an eight-transistor SRAM cell circuit construction and representation according to another embodiment.

FIGS. 9A to 12B show a top plan views and a schematic diagrams of various four-transistor SRAM cell circuit constructions and representations according to a number of embodiments.

FIGS. 13A to 16C show top plan views, schematic diagrams, and symbolic representations of various logic circuits according to a number of embodiments.

FIGS. 18A to 19C are side cross sectional views showing interconnection arrangements according to embodiments.

FIGS. 20 and 21 are flow diagrams showing design methods according to two particular embodiments.

FIG. 22 is an example of a portion of a netlist representation of an integrated circuit according to an embodiment.

DETAILED DESCRIPTION OF THE EMBODIMENTS

Various embodiments of the present invention will now be described in detail with reference to a number of drawings. The embodiments show circuits and methods for implementing predetermined functions with junction field effect transistor (JFET) devices, as well as data structures representing such circuits and design methods for such circuits.

Figure 1A:
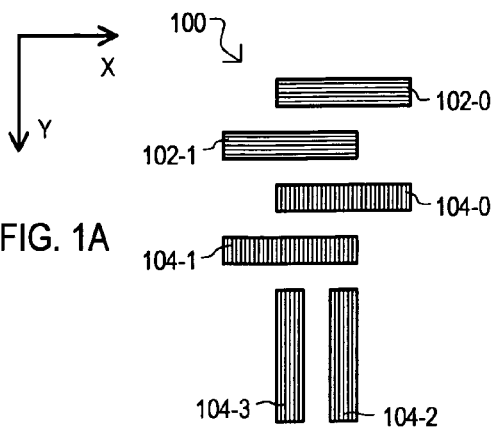
FIGS. 1A to 1D are top plan views and a schematic diagram showing a six transistor static random access memory (SRAM) cell circuit construction and representation according to a first embodiment.
Figure 1B:
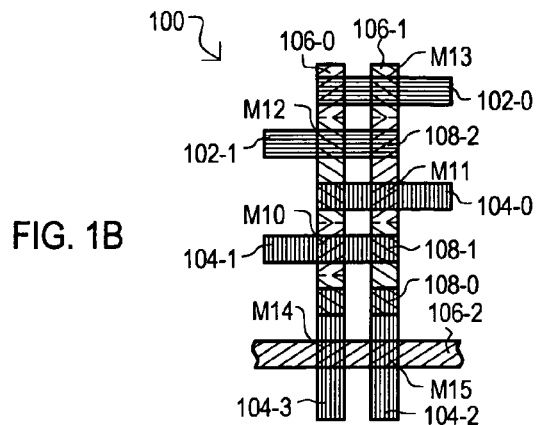
Figure 1C:
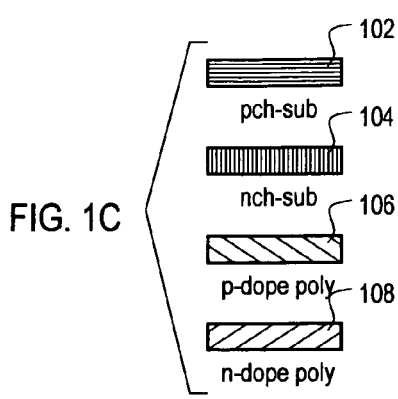
Figure 1D:
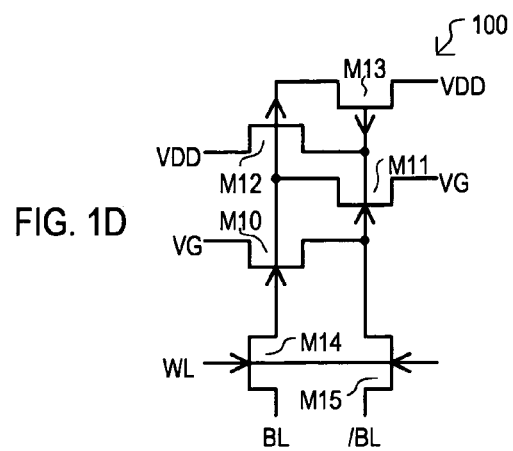

Referring now to FIGS. 1A to 1D, a circuit according to a first embodiment will now be described. FIGS. 1A and 1B show two layers used in forming a circuit 100. FIG. 1C is a key showing the hatching patterns used in FIGS. 1A and 1B. FIG. 1D is a schematic representation of the circuit 100.

Referring now to FIG. 1C, among the layers used to create a circuit 100 can be diffusion regions 102 and 104 (also referred to as "active areas") of different conductivity types, as well as conductive lines 106 and 108, formed from a semiconductor material that can be doped to different conductivity types.

Referring now to FIG. 1A, a circuit 100 can include a number of diffusion regions (102-0/1 and 104-0/1) elongated in a first direction (shown by arrow "X"). Such diffusion regions can be portions of a semiconductor substrate doped to different conductivity types, and isolated from one another by an isolation structure. Such isolation areas can be portions of a "bulk" semiconductor substrate, portions of a substrate formed by epitaxial deposition, and/or semiconductor "mesas" or "islands" formed on an insulating layer (e.g., silicon-on-insulator). Diffusion regions (102-0/1 and 104-0/1) can serve as active areas for forming channels and source/drains for junction field effect transistors (JFETs). In addition, such diffusion regions can serve as interconnections between JFETs and/or other circuit devices.

FIG. 1A also shows additional diffusion regions 104-3 and 104-2 elongated in a second direction (show by arrow "Y"). These diffusion regions (104-3 and 104-2) are situated at one end (bottom end of FIG. 1A) of the other diffusion regions (102-0/1 and 104-0/1).

It is understood that diffusion regions can have varying structures according to a type of JFET device utilized. In particular, for single-gate JFET devices, diffusion regions can comprise one conductivity type. However, for double-gate JFET devices, diffusion regions can include one conductivity type formed over another conductivity type.

Referring now to FIG. 1B, a circuit 100 can further include a number of conductive lines (106-0 and 106-1) arranged in parallel with one another, each arranged to intersect more than one of the diffusion regions (102-0/1 and 104-0/1). Conductive lines (106-0 and 106-1) can be formed by patterning and doping a semiconductor layer deposited over and in contact with the diffusion regions. Preferably, conductive lines (106-0 and 106-1) can include polysilicon doped to different conductivity types with a more conductive layer, such as silicide formed on a surface of such lines. Conductive lines (106-0 and 106-1) can form gates of JFETs, as well as portions of nodes (or nets) interconnecting such gates.

In such an arrangement, each conductive line (106-0 and 106-1) can form one or more JFET gates and provide conductive connections in one direction (Y) between such JFETs gates formed by such a line. At the same time, diffusion regions (102-0/1 and 1040/1) can provide conductive connections in another direction (X) between such conductive lines (106-0 and 106-1).

FIG. 1B also shows additional conductive line 106-2 each arranged to intersect more than one of the diffusion regions elongated in the second direction (104-2/3). Conductive line 106-2 can be formed in the same manner as conductive lines (106-0 and 106-1).

In the arrangement shown, and as will be described in more detail below, conductive lines (106-0 to 106-2) can include two different types of connections formed at intersections with corresponding diffusion regions. A first type of connection can be a JFET gate formation that includes a conductive line formed over and in contact with a diffusion region, and doped to an opposite conductivity type as a channel region within the diffusion region. A second type of connection can be a node formation that includes a conductive line formed over and in contact with a diffusion region, and doped to a same conductivity type as a channel region within the diffusion region. Thus, conductive line 106-0 is shown to include nodes 108-0 to 108-2, as well as JFETs gates for transistors M11 and M13.

Using the basic structure of intersecting diffusion regions and conductive lines described above, various standard circuits can be formed that can be more compact that conventional approaches, such as those implemented in complementary metal-oxide-semiconductor (CMOS) technology. Further, such circuits may dispense with metallization layers for interconnecting source/gate/drains of local (close proximity) transistors (i.e., no "local" interconnect metallization).

Referring now to FIGS. 1B and 1D, circuit 100 is shown to form a common circuit function that can be of high demand in many types of designs: a static random access memory (SRAM) cell, more particularly, a six-transistor (6T) SRAM cell. FIG. 1D shows transistor positions for n-channel JFETs (nJFETS) M10/11 and M14/13 and p-channel JFETs (pJFETS) M12/M13. It is understood that such JFETs can be single- or dual-gate JFETs as described in U.S. patent application Ser. No. 11/261,873 filed on Oct. 28, 2005 and Ser. No. 11/452,442 filed on Jun. 13, 1006, both by Ashok K. Kapoor, noted above, the contents of which are incorporated by reference herein.

As shown in FIG. 1D diffusion regions (102-0 and 102-1) can receive a high power supply voltage VDD, while diffusion regions (104-0 and 104-1) can receive a low power supply voltage VG. Diffusion regions (104-2 and 104-3) can be connected to complementary bit lines BL and /BL.

In this way, a standard circuit can be created or represented with JFET devices formed by parallel conductive lines of a doped semiconductor material that intersect common diffusion regions.

It is understood that a circuit like that of FIGS. 1A to 1D can be mirrored along the X direction and/or Y direction to allow for common power supply or bit line connections between adjacent cells. One such arrangement is shown in FIG. 2.

Figure 2:
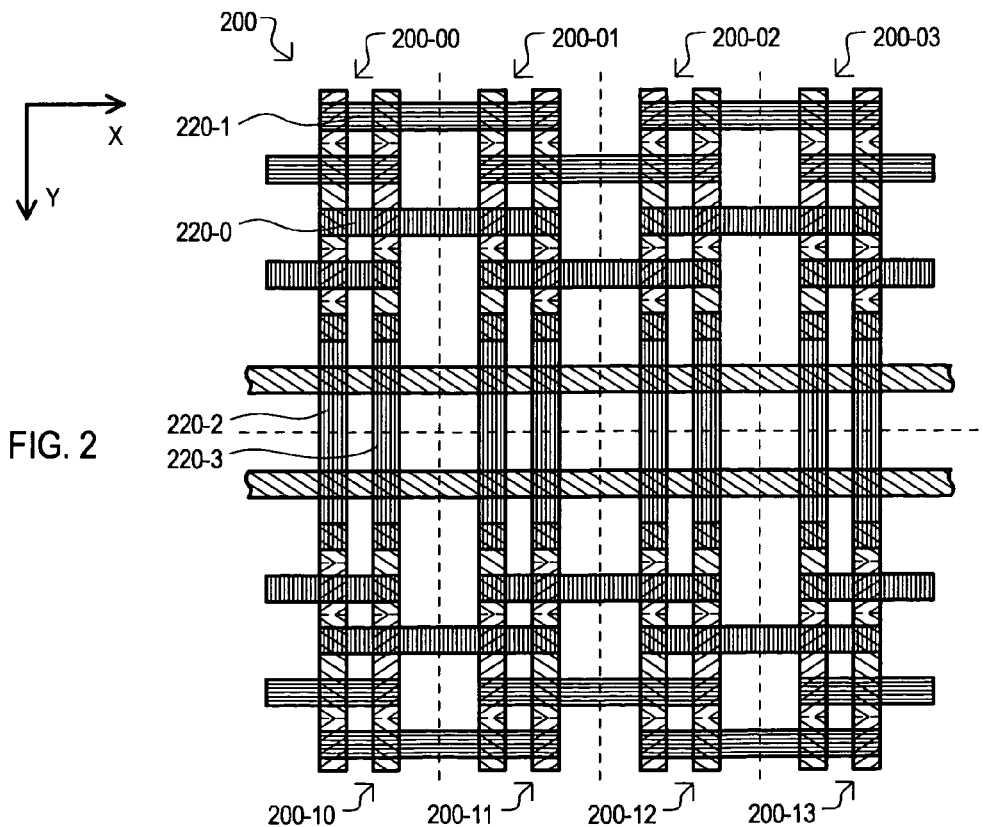
FIG. 2 is a top plan view showing repetition and mirroring of the circuit shown in FIGS. 1A to 1D.

Referring now to FIG. 2, a layout arrangement for multiple SRAM cells like that of FIG. 1B is shown in a top plan view and designated by the general reference character 200. Layout 200 can include eight interconnected SRAM cells (200-00 to 200-13). SRAM cells adjacent to one another in an X direction can share two diffusion regions. For example, SRAM cells 200-00 and 200-01 can share an n-type diffusion region 220-0 (i.e., an active area that provides an n-doped channel for n-channel JFETs) and a p-type diffusion region 220-1 (i.e., an active area that provides a p-doped channel for p-channel JFETs). Such an arrangement can allow power supply contacts to the diffusion regions to be advantageously situated at a border between the two cells. Similarly, SRAM cells adjacent to one another in a Y direction can share two diffusion regions. For example, SRAM cells 200-00 and 200-10 can share an n-type diffusion region 220-2 and 220-3. Such an arrangement can allow bit line contacts to the diffusion regions to be advantageously situated at a border between the two cells.

In this way, standard JFET circuits, as described above by example, can be mirrored and/or tiled to form arrays of such circuits interconnected to one another and to shared input/outputs (I/Os) (e.g., power supply inputs, signal inputs and outputs) in an efficient manner.

As noted above, circuits constructed according to the embodiments can be composed from basic elements formed by a cross over between a conductive line and a diffusion region. Such elements can be arranged, with conductive line sections arranged in a contiguous fashion, to form circuit nodes of interconnected elements. Such circuit nodes can be connected to one another by diffusion regions. Examples of such basic elements are shown in FIGS. 3A to 6C.

FIGS. 3A to 3C show a first element 300 that can form an nJFET device. FIGS. 3A and 3B show two orientations for such an element, while FIG. 3C shows a schematic representation of the element. As represented by FIG. 3C, an nJFET device can be a single-gate nJFET or double-gate nJFET. It is understood that element 300 can include a line portion 302 and a diffusion portion 304. A line portion 302 can be doped with a p-type dopant, or be a pattern representing such a doping, while a diffusion portion 304 can include an n-type doped channel region that may or may not include a p-type bottom gate.

FIGS. 4A to 4C show the same general views as FIGS. 3A to 3C, but for a p-JFET 400. Thus, a line portion 402 can be doped with an n-type dopant, or be a pattern representing such a doping, while a diffusion portion 404 can include a p-type doped channel region that may or may not include an n-type bottom gate.

FIGS. 5A to 5C show the same general views as FIGS. 3A to 3C, but for an n-doped node connection. In this arrangement a line portion 502 and diffusion portion 504 can both be doped to an n-type conductivity. Such an element may also form an n-well well biasing connection.

FIGS. 6A to 6C show the same general views as FIGS. 3A to 3C, but for a p-doped node connection having a line portion 602 and diffusion portion 604 both doped to a p-type conductivity. Such a connection 600 can be from/to a source/drain of a pJFET or from/to a gate of an nJFET. Such an element may also form a p-well well biasing connection.

Elements shown in FIGS. 3A to 6C can be arranged with line portions aligned with one another in a contiguous fashion, to thereby form one or more conductive lines. That is, according to the embodiments, a conductive line arranged in a Y direction can include any of elements 3A, 4A, 5A or 6A. Similarly, a conductive line arranged in an X direction can include any of elements 3B, 4B, 5B or 6B aligned with one another in a contiguous fashion.

In this way, a circuit containing JFET devices can be formed predetermined elements that form JFET and/or node connections.

While the above embodiments have shown arrangement that include two layers (or patterns) it is understood that an integrated circuit or circuit design can include additional layers to allow for interconnection between such a circuit to other regions of the overall integrated circuit. One particular arrangement showing such higher connection layers for the SRAM cell of FIG. 1B is shown in FIG. 7.

FIG. 7 is a top plan view of an SRAM cell 700 having the same sections as that of FIG. 1B. In addition, SRAM cell 700 includes a third layer pattern overlying diffusion regions and conductive lines that can form a high power-supply line 752-0, low power-supply line 752-1, and a global word line 752-2, and a fourth layer pattern overlying the third layer pattern that can form bit lines (750-0 and 750-1). In the particular example shown, connections between such higher layers and diffusion regions can be via contact pads 760-0 to 760-3, which can be formed from a same layer as the conductive lines.

Third and fourth higher layer patterns can be metallization layers formed and patterned according to lithographic techniques and/or data structures representing such patterns.

Figure 24A:
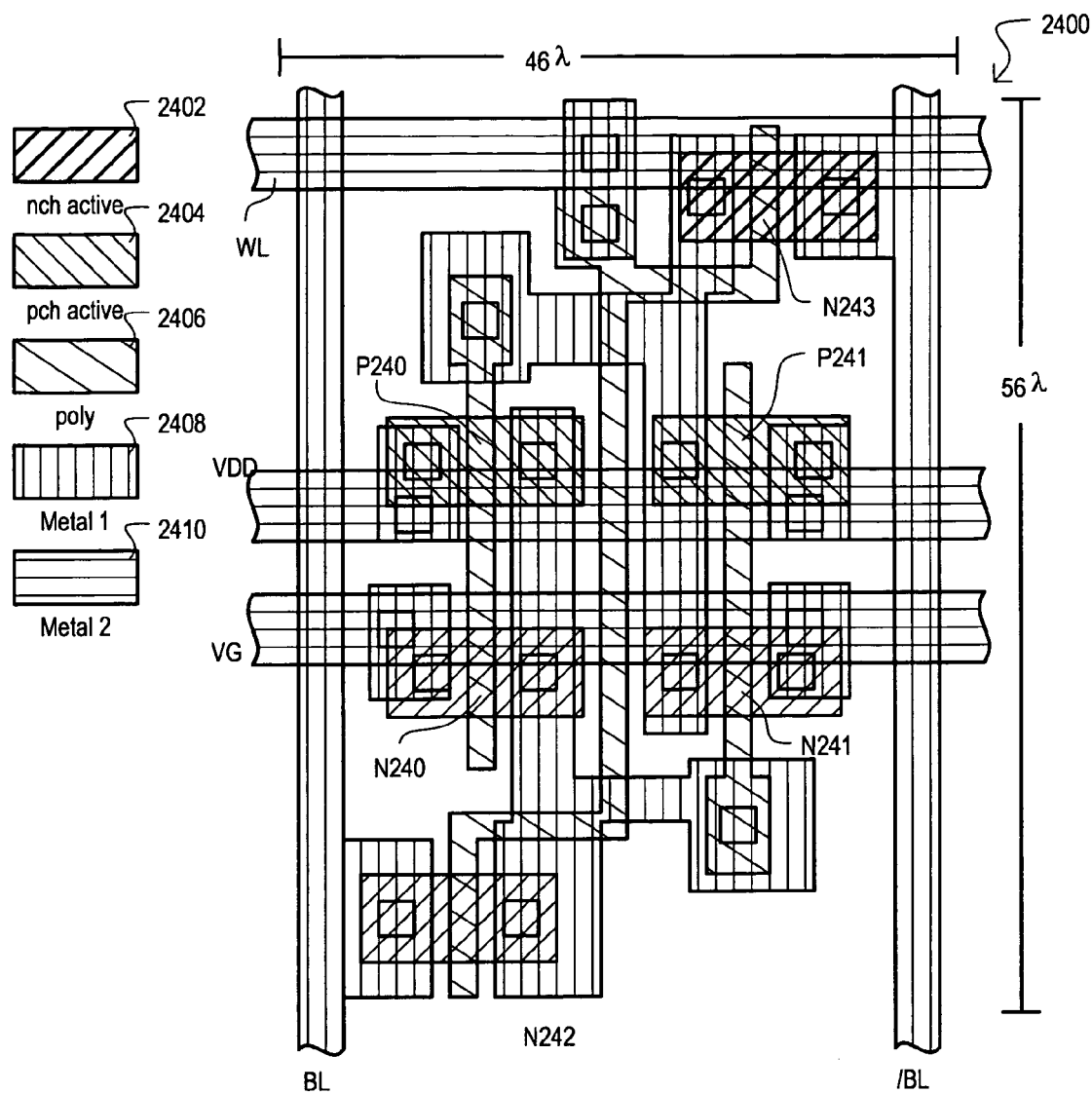
FIGS. 24A and 24B show a top plan view and a schematic diagram of a conventional six-transistor SRAM cell implemented with complementary metal-oxide-semiconductor (CMOS) technology.
Figure 24B:
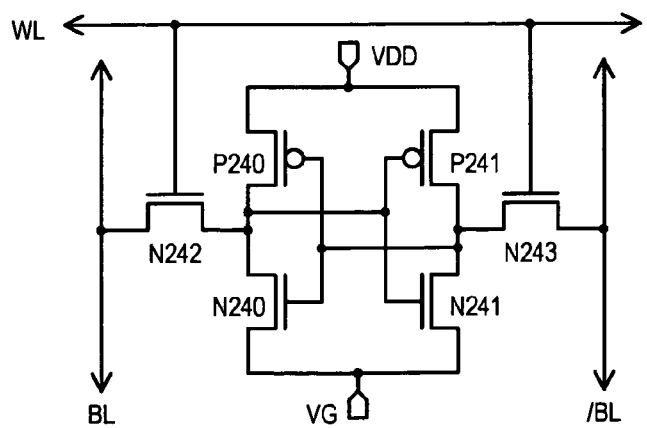

It is noted that an SRAM cell like that of FIG. 7 can occupy considerably smaller area than that of FIG. 24. For example, an SRAM cell 700 can have dimensions 9λ×34λ for a total area of 306λ$^2$. This is in contrast to the conventional cell of FIG. 7, which can occupy a total area of 2576λ$^2$.

While FIGS. 1A to 1C show a 6T SRAM cell, other embodiments can include implementations of different kinds of standard circuits formed using the same general techniques. A few of the many possible examples of such circuits will now be described.

Referring now to FIGS. 8A and 8B, one example of an eight-transistor (8T) SRAM cell is shown in a top plan view and a schematic diagram. FIGS. 8A and 8B include the same general circuit sections as FIGS. 1B and 1D, respectively. Accordingly, like sections are shown with the same reference character but with the first digit being an "8" instead of a "1".

Unlike the 6T SRAM cell 100, 8T SRAM cell 800 can further include additional passgate transistors M86 and M87, formed by diffusion regions 802-3 and 802-4 and conductive line 806-3. In the particular example shown, transistors M86 and M87 can be pJFETs. Thus, conductive line 806-3 can be n-type doped over p-type doped diffusion regions 802-3 and 8024. It is understood that diffusion regions 802-3 and 802-4 can be connected to a same (single port) or different (dual port) bit line set than diffusion regions 804-2 and 804-3. Further, additional pass transistors M86 and M87 could be implemented with nJFETs.

In this way, an 8T SRAM cell with JFET devices can be formed by parallel conductive lines over and in contact with multiple diffusion regions.

Referring now to FIGS. 9A and 9B, one example of a four-transistor (4T) SRAM cell is shown in a top plan view and a schematic diagram. FIGS. 9A and 9B can include the same general circuit sections as FIGS. 1B and 1D, respectively. Accordingly, like sections are shown with the same reference character but with the first digit being a "9" instead of a "1".

Unlike the 6T SRAM cell 100, 4T SRAM cell 900 may include only two diffusion regions 904-0 and 904-1 in an X direction. Further, resistors R90 and R91 can be included as loads for the cell. Resistors R90 and R91 can be formed as a portion of, or can be electrically connected to, conductive lines 906-0 and 906-1, respectively. In one particular example, resistors R90 and R91 can be formed by doping conductive lines with an impurity that can increase resistance, such as oxygen, as but one example.

FIGS. 10A through 12B show various other configurations for 4T SRAM cells utilizing JFETs of different conductivity types. Conductivity types are understood from the indicated hatching, which follows the conventions of FIGS. 1C and 3A to 6B.

While embodiments can include storage circuits, such as the SRAM cells like those described above, other embodiments can implement standard logic functions. A few examples of such embodiments will now be described.

Referring now to FIGS. 13A to 13C, a two input NAND gate according to an embodiment will now be described. FIG. 13A is a top plan view of the circuit showing a diffusion region (active area) layer and a conductive line layer. FIG. 13B is a schematic diagram showing devices in the same general position as FIG. 13A. FIG. 13C is the commonly understood symbol for the circuit.

Referring to FIG. 13A, a NAND gate 1300 can include diffusion regions 1302-0, 1302-1 and 1304 having elongated shapes in a first direction. In addition, three conductive lines 1306-0 to 1306-2 can be formed parallel to one another, and over an in contact with multiple diffusion regions in a second direction. Diffusion regions 1302-0 and 1302-1 provide p-type channels, while diffusion region 1304 provides n-type channels.

Conductive line 1306-0 can form a pJFET M134 with diffusion area 1302-0 and form an nJFET M133 with diffusion area 1304. Conductive line 1306-1 can form a pJFET M130 with diffusion area 1302-1 and an nJFET M132 with diffusion area 1304. Accordingly, conductive lines (1306-0 and 1306-1) can be oppositely doped to channel regions within the diffusion areas. In contrast, conductive line 1306-2 can be formed over all three diffusion regions (1302-0, 1302-1 and 1304) to form a common output node. Thus, conductive line 1306-2 can be doped to match the conductivity of these regions.

Referring now to FIGS. 14A to 14C, a two input NOR gate according to an embodiment will now be described. FIGS. 14A to 14C show the same general views as FIGS. 13A to 13C. As shown in FIG. 14A, NOR gate 1400 can have a same general layout as NAND gate 1300. However, diffusion region conductivities can be different, with diffusion regions 1404-0 and 1404-1 providing n-type channels, while diffusion region 1402 provides p-type channels. Conductive lines 1406-0 and 1406-1 can be oppositely doped at locations that cross diffusion regions, and conductive line 1406-2 can be doped the same at locations that crossed the diffusion regions.

In this way, a standard logic functions can be implemented or represented with JFET devices formed by parallel conductive lines of a doped semiconductor material, that intersect common diffusion regions.

Other embodiments of the present invention can include larger standard logic circuits formed by a combination of smaller standard logic circuits. Two such examples will now be described.

Referring now to FIGS. 15A to 15C, a reset-set (RS) NAND latch will now be described. FIGS. 15A to 15C show the same general views as FIGS. 13A to 13C. An RS NAND latch 1500 can be formed by cross coupling two NAND gates (1502-0 and 1502-1), like those shown in FIGS. 13A to 13C. Such a RS NAND latch 1500 can be combined with other smaller logic circuits to form larger standard logic circuits, such as a D-type flip-flop (FF), as but one example.

Referring now to FIGS. 16A to 16C, a four-input AND gate will now be described. FIGS. 16A to 16C show the same general views as FIGS. 13A to 13C. A four-input AND gate 1600 can be formed by two NAND gates 1602-0 and 1602-1 and a two input NOR gate 1604.

In this way, larger circuits can be formed by combining smaller standard circuits.

It is understood that, as in the various embodiments shown above, the layers shown for such circuits can be data structures representing a layout and/or mask layers for a portion of an integrated circuit. As will be described in more detail below, such data structures can form a portion of a library. Such a library can be accessed in an automated design method to create integrated circuits containing such layers.

Figure 17:
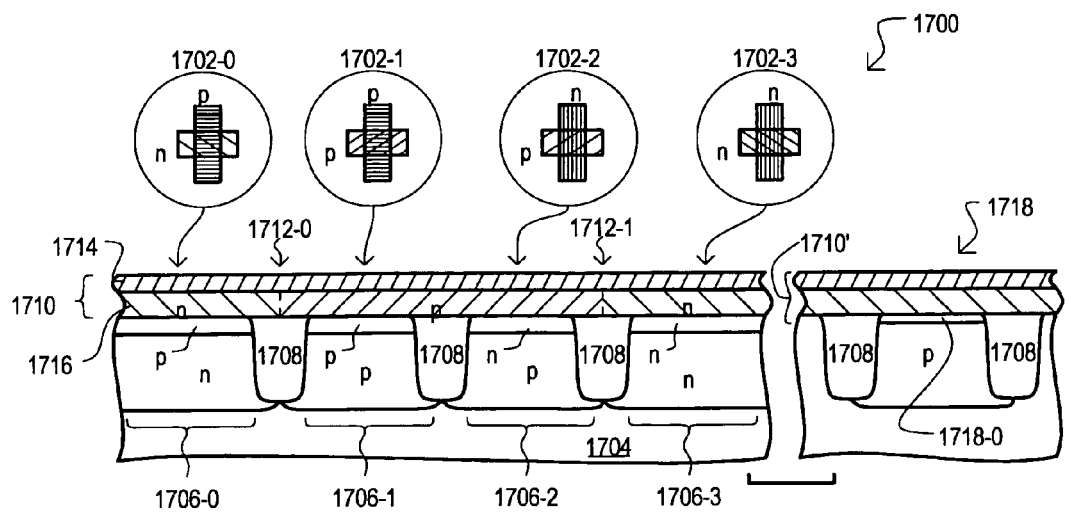
FIG. 17 is a side cross sectional view showing a physical implementation of an integrated circuit portion according to an embodiment.

Referring now to FIG. 17, an example of an integrated circuit physical structure, according to embodiments, will now be described. FIG. 17 is a side cross sectional view showing a circuit structure 1700 that incorporates elements 1702-0 to 1702-3, described previously. A circuit structure 1700 can include a substrate 1704 having diffusion regions (active areas) 1706-0 to 1706-3 of differing conductivity types. In the example shown, such active areas can be isolated from one another by electrical isolation structures 1708.

A conductive line 1710 can be formed over and in contact with diffusion regions (1706-0 to 1706-3). According to a doping difference or likeness with a below channel region, a conductive line 1710 can form a JFET element (1702-0 and 1702-1) or a node contact element (1702-2 and 1702-3). To allow conductive line 1710 to form a common node, a conductive material can be formed that spans at least the pn junctions (1712-0 and 1712-1) inherent in the conductive line 1710. In the particular example shown, such a conductive material can be a silicide layer 1714 formed over an entire top surface of a patterned polysilicon layer 1716.

Optionally, in some embodiments, JFET devices can be integrated with insulated gate field effect transistors (IGFETs). FIG. 17 shows one example of such an IGFET structure 1718 that can be formed in a same substrate as circuit structure 1700. Unlike the JFET/node structures, IGFET structures 1718 can include a gate insulator 1718-0 formed between a conductive line 1710 and substrate. Differing conductivity type IGFET devices (e.g., CMOS) can thus be incorporated to a design/device that includes JFET devices.

Of course, substrates can include various other arrangements, including but not limited to silicon-on-insulator (SOI) type substrates.

As described in one example in FIG. 7, a conductive line layer that forms JFET gates and substrate node connections can be connected to higher (but not local) interconnection layers. Examples of embodiments having such connections will now be described with reference to FIGS. 18A to 19C.

Figure 18A:
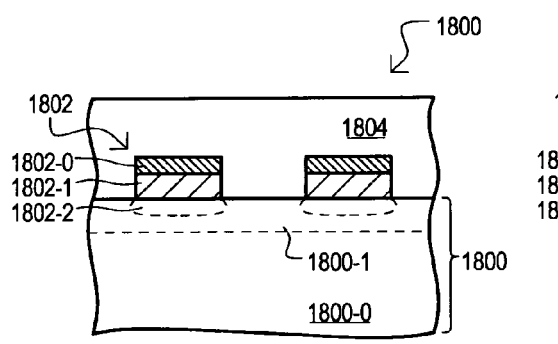

FIGS. 18A to 18D are a series of partial side cross sectional views of an integrated circuit device showing steps that can be used to fabricate interconnections to a conductive line layer that forms JFET gates and/or node connections. FIG. 18A shows a substrate 1800, conductive lines (one of which is shown as 1802), and an overlying insulating layer 1804. In the example shown, a substrate 1800 can include a substrate area 1800-0 and a channel region 1800-1. A channel region 1800-1 can be formed by doping a semiconductor material to a predetermined conductivity type. Conductive lines 1802 can include a semiconductor material 1802-1 having a more conductive layer 1802-0 formed thereon. As but one example, a semiconductor material 1802-1 can be polysilicon and a more conductive layer 1802-0 can be a silicide layer. A semiconductor material 1802-1 can be doped to a conductivity type that is opposite to or the same as an underlying channel region, according to the type structure being created (e.g., JFET or node contact). A conductive line 1802 can be fabricated according to conventional deposition and lithographic techniques. Also shown in FIGS. 18A to 18D are gate out-diffusions 1802-2. A gate out-diffusion 1802-2 can be formed by out diffusion of dopants from semiconductor material 1802-1 into a substrate. It is noted that a conductive line 1802 can also be a "pad" like structure that does not necessarily form a JFET or node connection, but rather provides an intermediate connection between a substrate and higher layer (such as a power supply connection path).

Figure 18B:
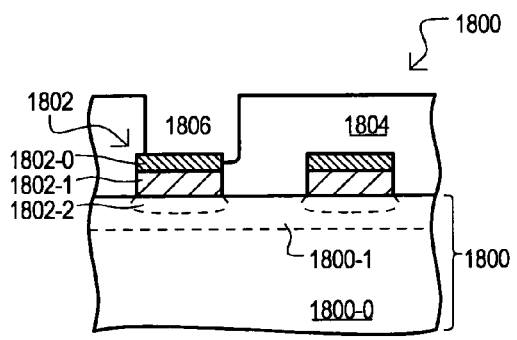

Referring now to FIG. 18B, an etching step can be performed that forms opening 1806 through insulating layer 1804 to expose conductive line 1802. Such a step can include an anisotropic etch, preferably a reactive ion etch. It is noted that while an opening 1806 can be a contact (or via) type opening that can provide a discrete vertical conductive connection between two conductive patterns, such an opening may also provide a lateral connection (i.e., parallel to a substrate surface) in a "damascene" type arrangement, and thus have a trench-like shape.

Figure 18C:
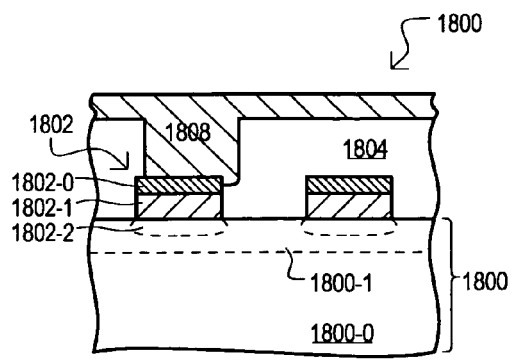

Referring now to FIG. 18C, an opening 1806 can be filled with an interconnect material 1808, such as a metal or metal alloy to provide ohmic contact with conductive line 1802. As but a few examples, such an interconnect material 1808 can be tungsten, a combination of titanium/tungsten (possibly including titanium nitride), copper, or a copper alloy such as copper/silver.

Figure 18D:
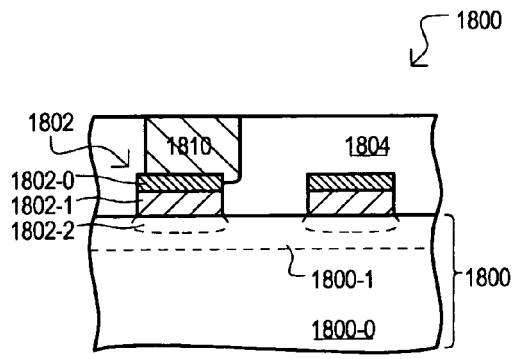

Referring now to FIG. 18D, an interconnect material 1808 can be planarized to remove an interconnect material on a top surface of insulating layer 1804. As but one example, an interconnect material 1808 can be planarized with a chemical-mechanical polishing (CMP) step and/or an etch-back step. As a result, an interconnect structure 1810 can be formed. Additional patterned layers can be formed over and in contact with interconnect structure 1810.

Figures 19A, 19B, 19C:
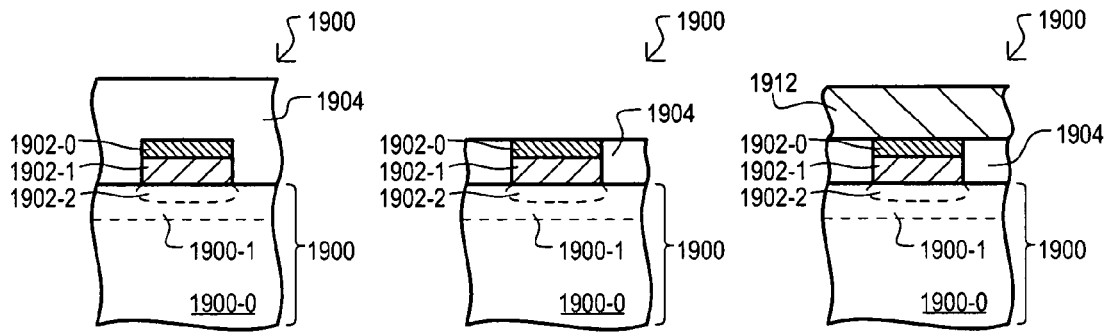

FIGS. 19A to 19C show alternative steps that can be used to fabricate interconnections to a conductive line layer. FIG. 19A shows the same general structures as shown in FIG. 18A, thus like portions are referred to by the same reference character but with the first two digits being "19" instead of "18".

Referring to FIG. 19B, unlike the arrangement of FIGS. 18A TO 18D, an insulating layer 1904 can be removed in a planar fashion to expose a top surface of a conductive line 1902. Such a step can a CMP step and/or an etch-back step.

Referring to FIG. 19C, a conductive layer 1912 can be formed over and in contact with an exposed portion of conductive line 1902. Such a step can include the deposition of one or more conductive materials. Such a conductive layer 1912 can be patterned with lithography and etch steps to form a higher level interconnect layer.

As noted above, the patterns shown in any of FIGS. 1A, 1B, 2, 3A/B, 4A/B, 5A/B, 6A/B, 7, 8A, 9A, 10A, 11A, 12A, 13A, 14A, 15A, 16A, in addition to being physically realized semiconductor circuit layers, can also be patterns represented by data structures. For example, such data structures can be incorporated into a larger design to create a physical integrated circuit design, integrated circuit layout, and/or manufacturing masks for fabricating such an integrated circuit.

Various examples of embodiments that can include such data structures will now be described.

Figure 20:
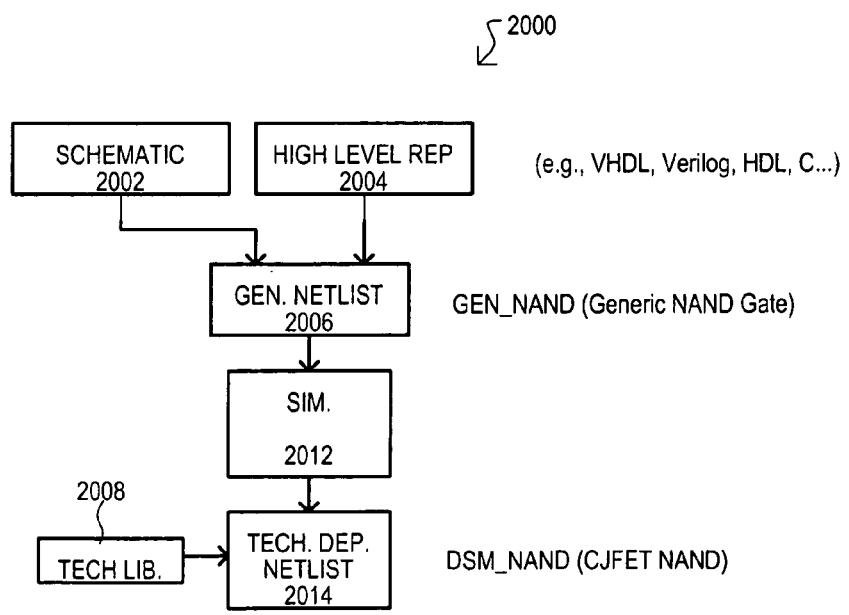

Referring now to FIG. 20, a method of designing an integrated circuit according to one particular embodiment is shown in a flow diagram and designated by the general reference character 2000.

A method 2000 can include creating representing an integrated circuit in a higher level form. In the method of FIG. 20, this can include representing an integrated circuit in a high level block schematic form (step 2002) and/or a higher level design language (step 2004).

A method 2000 can also include generating a more detailed (i.e., lower level) representation of the design described by interconnected circuit blocks. In FIG. 20, this step can include generating a generic netlist (step 2006). Such a generic netlist can include higher order representations of circuit blocks interconnected to one another by nets. It is noted that such circuit blocks do not indicate a physical characterization of such blocks.

A method 2000 can further include a simulation step (step 2012). Such a step can test a generic netlist design to see if the circuit functions operate as desired.

A method 2000 can continue by generating a technology dependent netlist (step 2014). A technology dependent netlist can be created using a technology dependent library 2008. In particular, generic circuit structures of a generic netlist can be replaced by circuit elements representing JFET implementations of such circuits, as shown in the above embodiments. A technology dependent library 2008 can include circuit elements representing actual JFET circuit devices and/or JFET-based standard logic circuits, like those described above. Thus, a technology dependent netlist can be a representation of all or a portion of an integrated circuit design at a more detailed level. For example, while a generic netlist may represent a NAND gate on a generic level (i.e., inputs, propagation time, etc.), a technology dependent netlist would represent such a circuit as a NAND gate in complementary JFET (CFET) form.

In this way, a method can translate a higher level design representation into a more detailed representation that includes JFET devices and/or circuits meeting physical layout limitations for structures like those described in the above embodiments.

Referring now to FIG. 21, a method of designing an integrated circuit according to another embodiment is shown in a flow diagram and designated by the general reference character 2100.

A method 2100 can include some of the same general steps as shown in FIG. 20, and so like steps are referred to by the same reference character but with the first digit being a "21" instead of a "20".

A method 2100 can differ from that of FIG. 20 in that a higher level design representation can be translated directly into a technology dependent netlist (step 2106). Such a step can dispense with a generic representation of a design, and instead, utilize JFET-based representations of a technology dependent library 2108.

A method 2100 can then create a layout for the design based on the technology dependent netlist (step 2120). Such a step can include arranging such circuits into interconnected "flattened" elements corresponding to a resulting integrated circuit. Such a step can include incorporating elements and/or patterns like those described above with other circuit elements.

A resulting layout can then be subject to a design rule check (DRC) (step 2122). A design rule check can ensure that a design does not violate particular rules related to the physical placement of circuit elements.

Following either methods of FIG. 20 or FIG. 21, a series of masks can be created for the integrated circuit. Such masks can include patterns corresponding to any of the patterns shown in the above embodiments.

Referring now to FIG. 22, one particular example of a technology dependent netlist is shown in text form. A netlist 2200 can include declarations of element types. In the particular example shown, element types can include JFET declarations 2202 that can describe both nJFETs, pJFETS, and interconnections of such FETs to particular nets.

The particular example of FIG. 22 also anticipates incorporation of IGFET (e.g., MOS) type transistors into the same integrated circuit. Consequently, the netlist 2200 also includes declarations of p-channel and n-channel MOS transistors 2204.

It is understood that JFET devices, and connections to such devices, can be realized all or in part with elements like those shown in FIGS. 3A, 4A, 5A and 6A.

Figure 23:
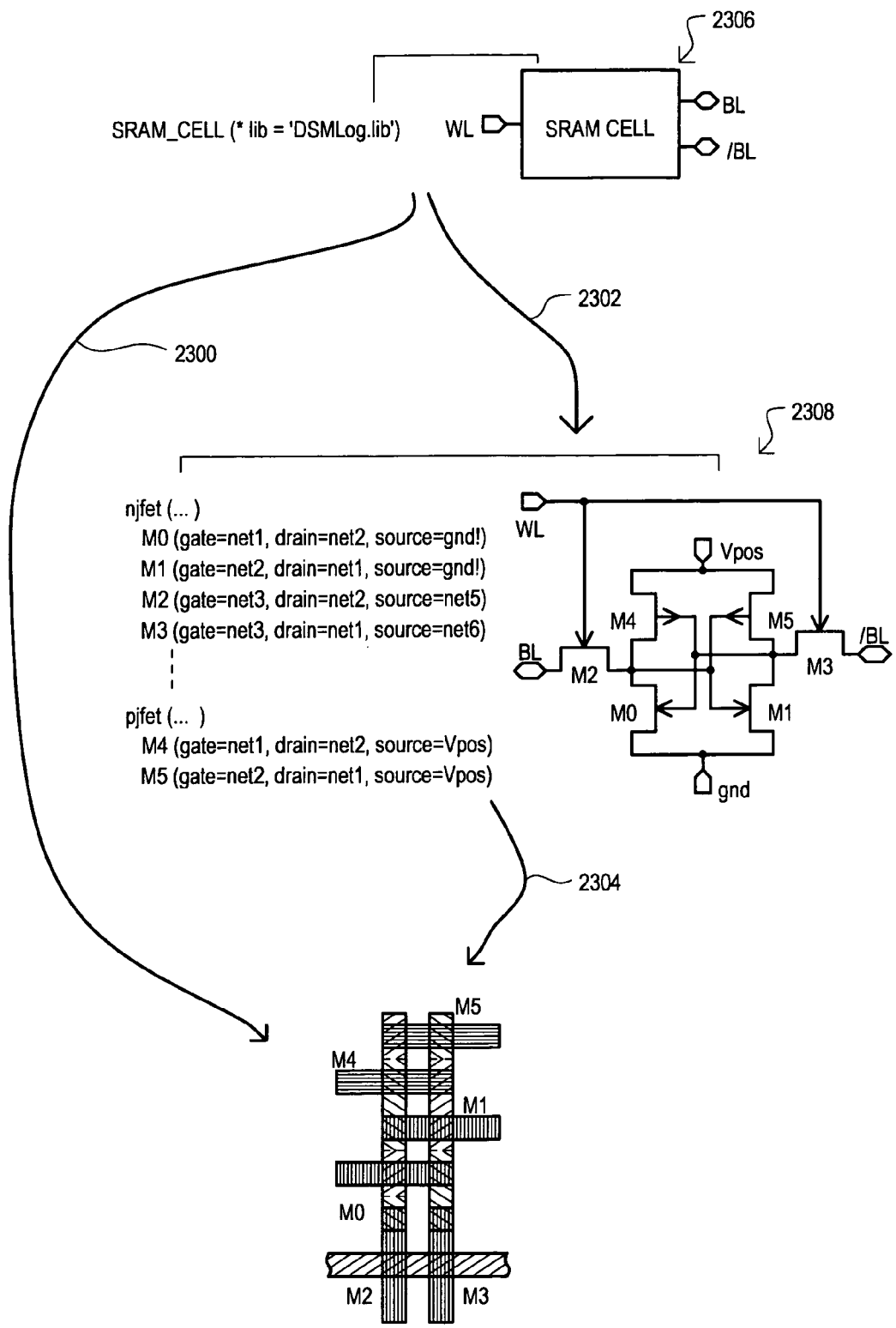
FIG. 23 is a diagram showing two design flows according to two particular embodiments.

Referring now to FIG. 23, particular representations of a design flow according to an embodiment is shown in a diagram. FIG. 23 shows two possible approaches, one represented by arrow 2300 and another represented by arrows 2302 and 2304. A first flow 2300 can start with a higher level representation of a standard circuit 2306, in this case a 6T SRAM cell. Such a higher level representation standard circuit can be translated directly to a physical representation 2308 by accessing a pre-existing layout representation for the standard circuit.

A second flow 2302/2304 can also start with a higher level representation 2306 of a standard circuit. As shown by arrow 2302, such a standard circuit can then be represented by a device level representation 2308 that describes discrete devices (e.g., transistors) and interconnections between such devices. A second flow 2302/2304 can then translate device level representation 2308 into a physical representation 2308 by constructing the device level representation from elements like those shown in FIGS. 3A, 4A, 5A and 6A.

In this way, integrated circuit designs can translate higher level representations of standard circuits into physical representations of JFET-based circuits having parallel conductive lines crossing over multiple diffusion regions.

It is noted that reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
   at least a first diffusion region formed by doping a semiconductor substrate;
   at least a second diffusion region formed by doping the semiconductor substrate, the second diffusion region being separated from the first diffusion region by an isolation region;
   at least a first conductive line comprising a semiconductor material formed over and in contact with the first diffusion region and the second diffusion region, a portion of the first conductive line in contact with the first diffusion region being doped to an opposite conductivity type as the first diffusion region; and
   at least a second conductive line comprising a semiconductor material formed in parallel with the first conductive line and over and in contact with the first diffusion region and the second diffusion region, a portion of the second conductive line in contact with the first diffusion region being doped to a same conductivity type as the first diffusion region.

2. The semiconductor device of claim 1, wherein
   the first diffusion region and second diffusion region are essentially parallel to one another in a first direction; and
   the first conductive line and second conductive line are essentially parallel to one another and essentially perpendicular to the first direction.

3. The semiconductor device of claim 1, wherein:
   the first conductive line and second conductive line comprise silicon and include oppositely doped sections.

4. The semiconductor device of claim 1, wherein:
   the first and second diffusion regions are doped to the same conductivity type;
   at least a first junction field effect transistor (JFET) cross-coupled to a second JFET, the first JFET including a gate that includes the portion of the first conductive line over and in contact with the first diffusion region, and a drain that includes the portion of the first diffusion region over and in contact with the second conductive line,
   the second JFET including a gate that includes the portion of the second conductive line over and in contact with the second diffusion region, and a drain that includes the portion of the second diffusion region over and in contact with the first conductive line.

5. The semiconductor device of claim 4, further including:
   at least a third diffusion region formed by doping the semiconductor substrate, the third diffusion region being separated from the first and second diffusion regions by the isolation region and aligned along a common axis with and in contact with the first conductive line;
   at least a fourth diffusion region formed by doping the semiconductor substrate, the fourth diffusion region being separated from the first, second, and third diffusion regions by the isolation region and aligned along a common axis with and in contact with the second conductive line;
   at least a third conductive line comprising a semiconductor material formed in contact with the third diffusion region and fourth diffusion regions, a portion of the third conductive line in contact with the third diffusion region being doped to the opposite conductivity type as the third diffusion region, and a portion of the third conductive line in contact with the fourth diffusion region being doped to the opposite conductivity type as the fourth diffusion region; and
   at least a first pass JFET and a second pass JFET, the first pass JFET including a gate that includes the portion of the third conductive line over and in contact with the third diffusion region, and the second pass JFET including a gate that includes the portion of the third conductive line over and in contact with the fourth diffusion region.

6. The semiconductor device of claim 5, further including:
   the first conductive line further comprises at least a portion of a first impedance device; and
   the second conductive line further comprises at least a portion of a second impedance device; wherein
   the first and second JFETs, first and second pass JFETs, and first and second impedance devices form a four-transistor static random access memory cell.

7. The semiconductor device of claim 5, further including:
   at least a first bit line coupled to the third diffusion region;
   the first and second JFETs, first and second pass JFETs, and first and second impedance devices form a portion of a static random access memory (SRAM) cell; and
   the third conductive line comprises a word line of the SRAM cell.

8. The semiconductor device of claim 5, further including:
   the first diffusion region and second diffusion regions are doped to a same first conductivity type;
   at least a fifth diffusion region formed by doping the semiconductor substrate to a second conductivity type, the fifth diffusion region being separated from the first, second, third and fourth diffusion regions by the isolation region;
   at least a sixth diffusion region formed by doping the semiconductor substrate to the second conductivity type, the sixth diffusion region being separated from the first, second, third, fourth and fifth diffusion regions by the isolation region;
   the first conductive line is further formed over and in contact with the fifth diffusion region and sixth diffusion region, a portion of the first conductive line in contact with the fifth diffusion region being doped to an opposite conductivity type as the fifth diffusion region, a portion of the first conductive line in contact with the sixth diffusion region being doped to a same conductivity type as the sixth diffusion region;

the second conductive line is further formed over and in contact with the fifth diffusion region and sixth diffusion region, a portion of the second conductive line in contact with the sixth diffusion region being doped to an opposite conductivity type as the sixth diffusion region, a portion of the second conductive line in contact with the fifth diffusion region being doped to a same conductivity type as the fifth diffusion region;

at least a third JFET cross-coupled to a fourth JFET of opposite channel conductivity types as the first and second JFETs, the third JFET including a gate that includes the portion of the first conductive line over and in contact with the fifth diffusion region, and a drain that includes the portion of the fifth diffusion region over and in contact with the second conductive line, the fourth JFET including a gate that includes the portion of the second conductive line over and in contact with the sixth diffusion region, and a drain that includes the portion of the fifth diffusion region over and in contact with the first conductive line; wherein the first, second, third and fourth JFETs form a cross-coupled latch of a static random access memory (SRAM) cell, and first and second pass JFETs form passgates for the SRAM cell, and the third conductive line forms at least a first wordline of the SRAM cell.

9. The semiconductor device of claim 8, wherein:

at least a seventh diffusion region formed by doping the semiconductor substrate, the seventh diffusion region being separated from the first through sixth diffusion regions by the isolation region and aligned along a common axis with and in contact with the first conductive line;

at least an eighth diffusion region formed by doping the semiconductor substrate, the eighth diffusion region being separated from the first through seventh regions by the isolation region and aligned along a common axis with and in contact with the second conductive line;

at least a fourth conductive line comprising a semiconductor material formed in contact with the seventh diffusion region and eighth diffusion regions, a portion of the fourth conductive line in contact with the seventh diffusion region being doped to the opposite conductivity type as the seventh diffusion region, and a portion of the fourth conductive line in contact with the eighth diffusion region being to the opposite conductivity type as the eighth diffusion region; and at least a third pass JFET and a fourth pass JFET, the third pass JFET including a gate that includes the portion of the fourth conductive line over and in contact with the seventh diffusion region, and the fourth pass JFET including a gate that includes the portion of the fourth conductive line over and in contact with the eighth diffusion region.

10. The semiconductor device of claim 1, further including:

the first diffusion region is doped to a first conductivity type;

the second diffusion region is doped to a second conductivity type;

at least a third diffusion region formed by doping the semiconductor substrate to the first conductivity type; and the second conductive line is further formed over and in contact with the third diffusion region, a portion of the second conductive line in contact with the third diffusion region being doped to a same conductivity type as the third diffusion region; and at least a third conductive line comprising a semiconductor material formed in parallel with the first and second conductive lines and over and in contact with the second diffusion region and the third diffusion region, a portion of the third conductive line in contact with the second diffusion region being doped to an opposite conductivity type as the second diffusion region, and a portion of the third conductive line in contact with the third diffusion region being doped to an opposite conductivity type as the third diffusion region; and the first conductive line forms at least a portion of a first input of a logic gate, the second conductive line forms at least a portion of an output of the logic gate, and the third conductive line forms at least a portion of a second input of the logic gate.

11. The semiconductor device of claim 10, wherein:

the logic gate is selected from the group consisting of a NAND gate and a NOR gate.

* * * * *